United States Patent
Ishikawa

(10) Patent No.: US 7,251,180 B2
(45) Date of Patent: Jul. 31, 2007

(54) SEMICONDUCTOR MEMORY DEVICE

(75) Inventor: Toru Ishikawa, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/365,857

(22) Filed: Mar. 2, 2006

(65) Prior Publication Data

US 2006/0198207 A1    Sep. 7, 2006

(30) Foreign Application Priority Data

Mar. 7, 2005    (JP)    ............................. 2005-062542

(51) Int. Cl.
G11C 7/00    (2006.01)
(52) U.S. Cl. ............ 365/222; 365/189.01; 365/189.02; 365/189.07; 365/236
(58) Field of Classification Search ................ 365/222, 365/189.01, 189.02, 189.07, 236
See application file for complete search history.

(56) References Cited

U.S. PATENT DOCUMENTS 5,467,315 A * 11/1995 Kajimoto et al. ........... 365/222
5,629,898 A     5/1997 Idei et al.
6,473,358 B2 * 10/2002 Noda et al. ............ 365/230.06

FOREIGN PATENT DOCUMENTS

JP    62-223893 A    10/1987
JP    8-306184 A    11/1996

* cited by examiner

*Primary Examiner*—Richard T. Elms
*Assistant Examiner*—Pho M. Luu
(74) *Attorney, Agent, or Firm*—Sughrue Mion, PLLC

(57) ABSTRACT

An apparatus a counter, storage units for storing count values interrupted by a row address whose refresh period is subject to change; comparator circuits for comparing the counter outputs and the contents of the storage units to each other as to whether or not the counter outputs coincide with the contents of the storage units; a holding circuit for setting an output hit signal to an active state when a coincidence signal is output from the comparator circuits and for resetting the hit signal to an inactive state in the next following clock cycle; a circuit performing control for not propagating a refresh clock signal to the counter when the hit signal is in an active state and for propagating the refresh clock signal to the counter when the hit signal is in an inactive state; a circuit for replacing an output of the counter by a row address which changes part of the counter output when the hit signal is in an activate state to replace the counter output with the row address whose refresh period is subject to change to output the row address whose refresh period is subject to change as a refresh address.

20 Claims, 10 Drawing Sheets

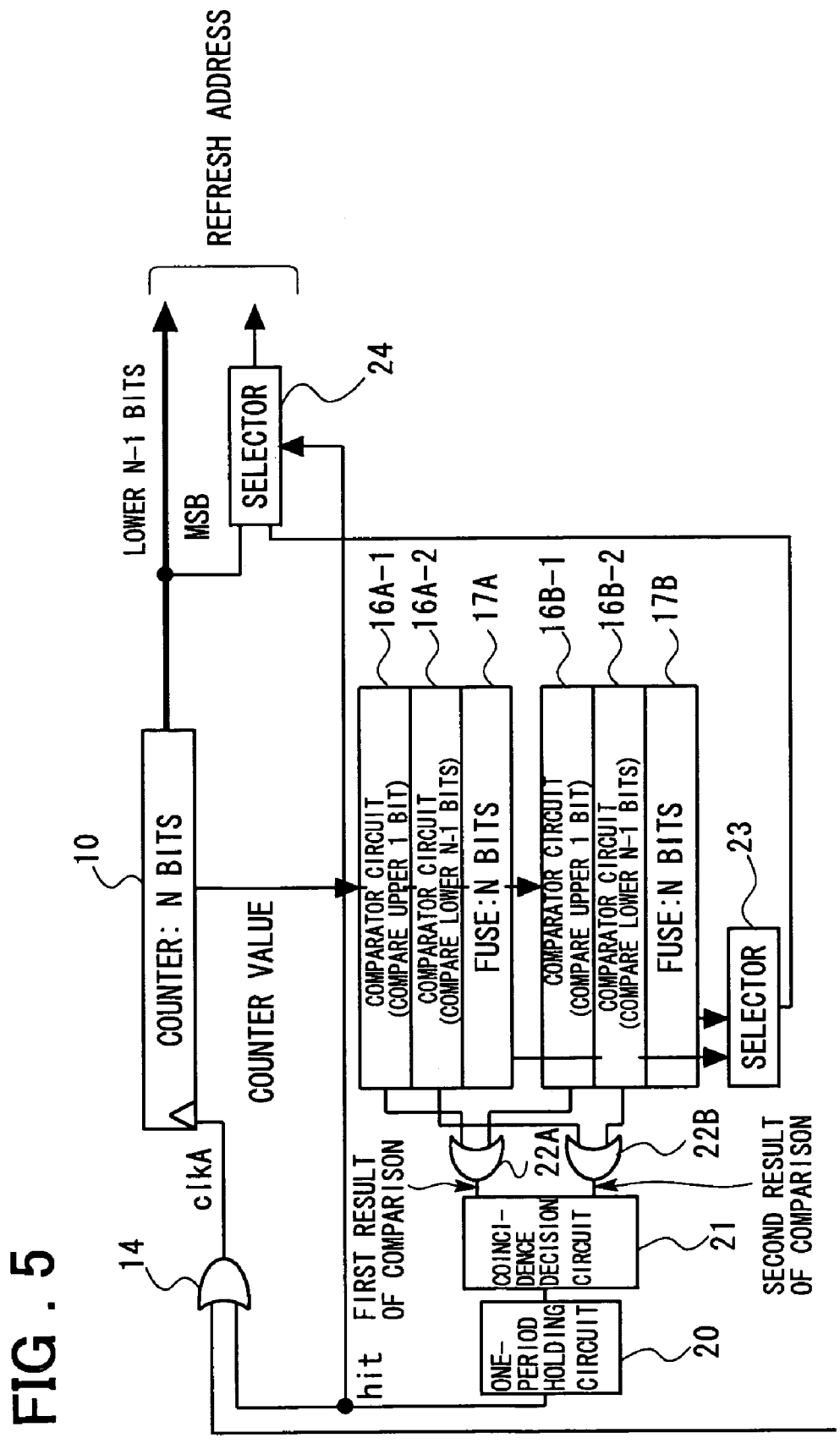

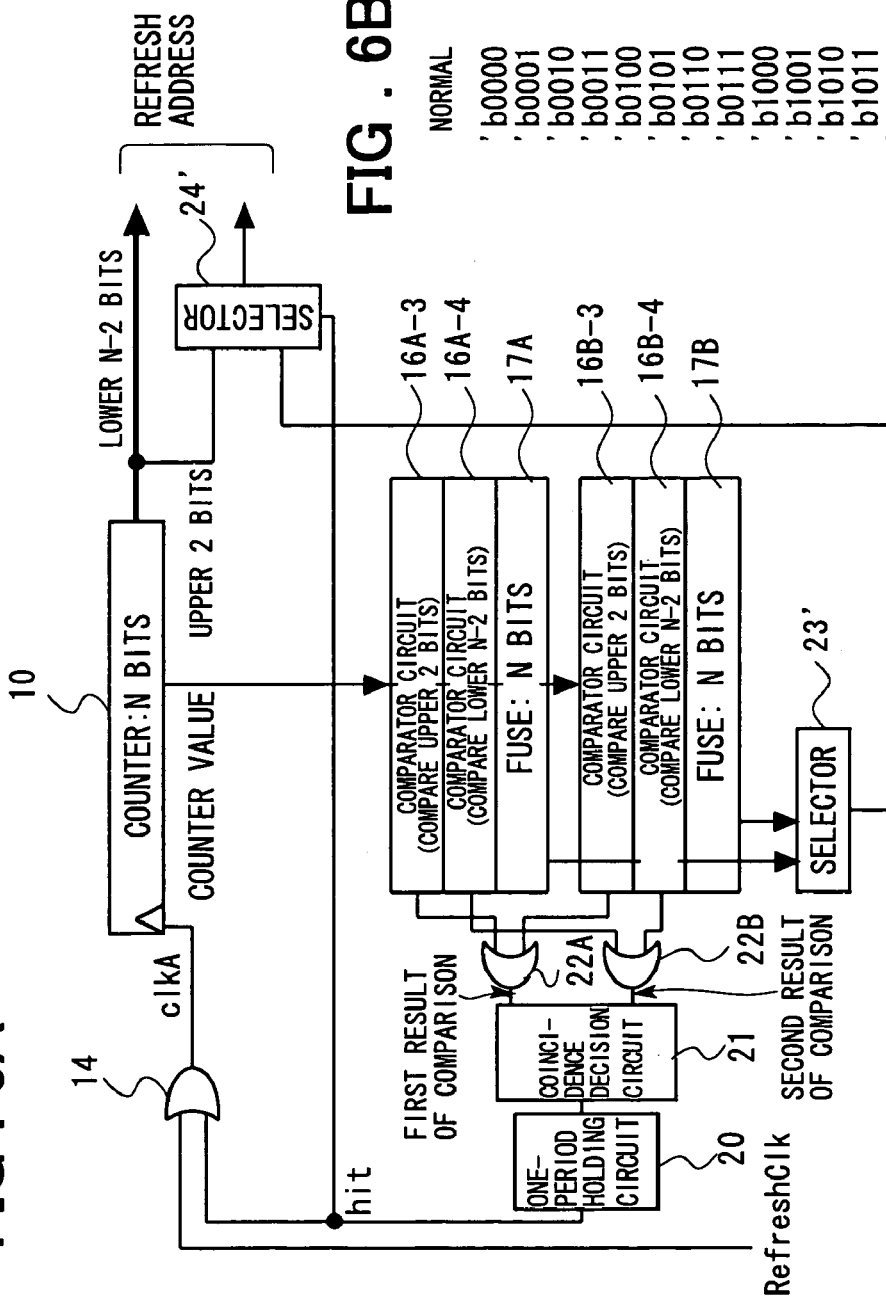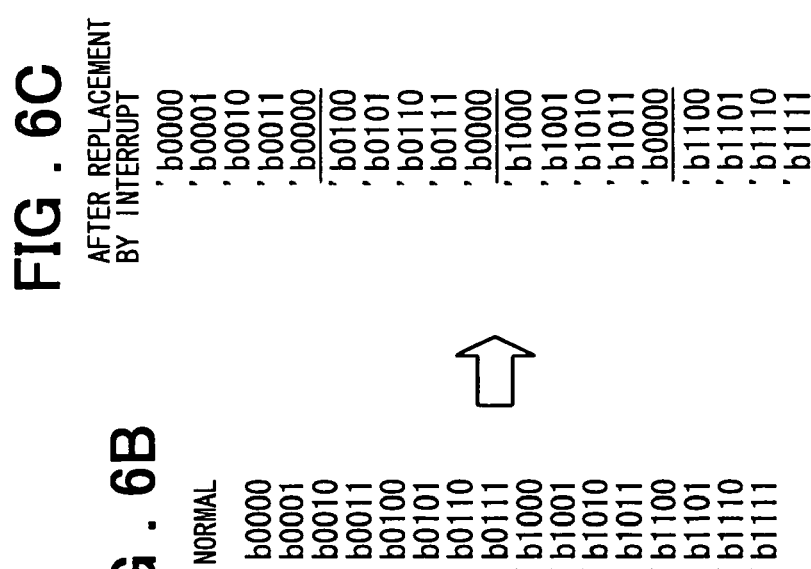

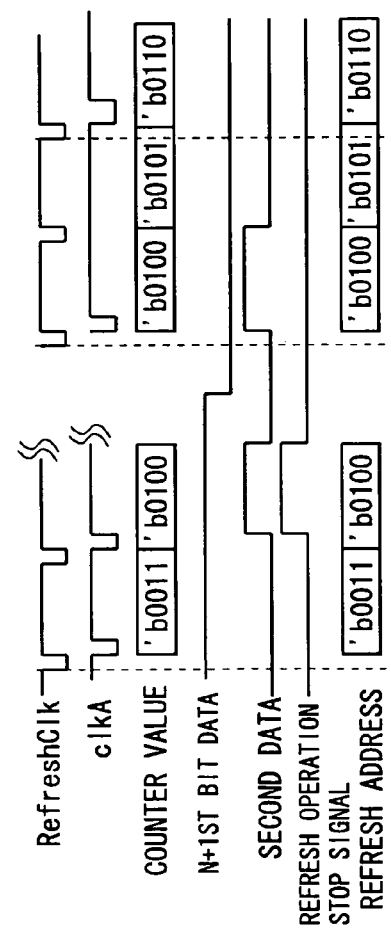

SEMICONDUCTOR MEMORY DEVICE

FIELD OF THE INVENTION

This invention relates to a semiconductor memory device. More particularly, this invention relates to a semiconductor memory device in need of refresh for data retention and a refresh control technique.

BACKGROUND OF THE INVENTION

A dynamic random access memory, which is typically comprised of an array of a large number of cells, each being made up by a capacitor for data retention and a transistor connected between a bit line and the capacitor and having a gate connected to a word line, is able to have large amount of memory capacity. However, in dynamic random access memory, the data is retained in the capacitor, and hence a refresh operation, which comprises the steps of amplifying memory cell data by a sense amplifier via bit line at a preset period and writing the data again from the bit line to the memory cell, is needed for data retention.

A refresh address is generated by a counter which receives a refresh clock signal generated based on e.g. a timer and counts up the clock signal received. The refresh address is supplied to a multiplexer which selects one between a row address of a normal access and the refresh address. More specifically, during the refresh operation, the multiplexer selects the refresh address, based on a refresh control signal, and the so selected refresh address is supplied to an X-decoder. A word line selected by the X-decoder is activated, and a sense amplifier is also activated to carry out refreshing. The word line selected is subsequently deactivated.

As to the refresh control of a cell having a short refresh period, that is, having a data retention time shorter than in other cells, the following two techniques have so far been proposed.

For example, Patent Document 1 (JP Patent Kokai Publication No. JP-A-62-223893) discloses a configuration in which memory cells are periodically refreshed based on a counter operation. The row address with a shorter refresh period is refreshed simultaneously with the row address, which is a refresh address generated by the counter, whereby the row address with a shorter refresh period is refreshed with the shorter period, as shown in FIG. 1A. For example, a refresh address 0 is refreshed with a period equal to one-half the refresh period.

In this configuration, the other row address in addition to the refresh address need to be refreshed simultaneously. Since two word lines are refreshed simultaneously, the sense noise in the DRAM is doubled. Hence, a variety of circuits in the memory device, such as power supply, ground lines or boost level supply circuit, need to be enhanced in order to cope with the doubled sense noise, thus enlarging the circuit scale.

Moreover, the condition of the above-described simultaneous refresh operation differs from that of the normal refresh operation, and hence, in a memory having a high-speed input/output circuit, such problems as deteriorated characteristics of the input/output circuit may arise exclusively during the simultaneous refresh operation.

The Patent Document 2 (JP Patent Kokai Publication No. JP-A-8-306184) discloses a configuration in which the refresh operation may be carried out in keeping with the information retention time of the memory cells. More specifically, a first pulse, corresponding to the refresh period which is set to be shorter than the shortest memory cell information retention time (data retention time), is generated. The first pulse is counted by a refresh address counter to generate a refresh address. A second pulse signal is generated by frequency-dividing a carry signal which is generated by the refresh address counter for one cycle of the refresh operation (divided pulse signal). The refresh period setting information, associated either with the short period of the first pulse or with the long period of the second pulse is stored in a storage circuit every plural word lines allocated to theses refresh addresses. The refresh operation for the memory cells, carried out based on the refresh address is rendered valid or invalid, for each word line, in association with the refresh period setting information stored in the storage circuit. The refresh period setting information is rendered invalid by the second pulse signal. In this DRAM, the first pulse, which is associated with the refresh period, and which selected to be shorter than the shortest data retention time, is generated, such that it is necessary to generate a clock signal having a period adjusted so as to hold data even in the memory cells with the shortest refresh period. In DRAMs, since the refresh trigger command period from a controller is fixed, it is generally difficult to generate such a clock signal from one particular DRAM to another.

The refresh operations may be carried once every two periods of the refresh trigger command from the controller, as shown in FIG. 1B. Although this may be efficacious in suppressing the power usage, it is not possible to relieve the memory cells with the short refresh period.

[Patent Document 1]
  JP Patent Kokai Publication No. JP-A-62-223893

[Patent Document 2]
  JP Patent Kokai Publication No. JP-A-8-306184

SUMMARY OF THE DISCLOSURE

The present invention has been invented to solve the above described problems and it an object to provide an apparatus and a method for carrying out refreshing of memory cells different in data retention times with noise at the time of the sense operation prevented from increasing.

The above and other objects may be attained by the present invention having the following configuration.

A semiconductor memory device in accordance with one aspect of the present invention, comprises: a memory array including a plurality of cells, each of which needs refreshing for data retention; means for generating a refresh address of said memory array; means for deciding on whether or not said refresh address generated corresponds to an address to be interrupted by a row address whose refresh period is subject to change; and means for performing control for interrupting said generated refresh address to output said row address whose refresh period is subject to change, if the result of decision indicates that the generated refresh address is the address which is to be interrupted by said row address whose refresh period is subject to change.

A semiconductor memory device in accordance with another aspect of the present invention, comprises: a memory array including a plurality of cells, each of which needs refreshing for data retention; a counter; storage means for storing information as to whether or not an output of said counter corresponds to an address interrupted by a row address whose refresh period is subject to change in association with a count value; means for performing control so that, if the output of said counter corresponds to the address interrupted by said row address whose refresh period is subject to change, said counter output is interrupted by said row address whose refresh period is subject to change, and said row address whose refresh period is subject to change is output as a refresh address.

A method in accordance with another aspect of the present invention is a method for refresh control of a semiconductor memory device in need of a refresh operation for data retention. With this method, the information as to whether or not a count value of a counter generating refresh address, corresponding to an address interrupted by the row address whose refresh period is subject to change, is pre-stored in association with each count value of the counter generating the refresh address. The counter output is compared to the address to be interrupted by the row address whose refresh period is subject to change, in order to decide on whether or not the counter output corresponds to the row address to be interrupted by the row address whose refresh period is subject to change. If the result of comparison is affirmative, the row address whose refresh period is subject to change is, is caused to interrupt the counter output, and is output as a refresh address.

Preferably, in the present invention, the row address whose refresh period is subject to change is output a plural number of times as the counter completes one full cycle. Preferably, in the present invention, said row address whose refresh period is subject to change includes at least a row address output M times, where M is an integer not less than two, and a row address output N times, where N is an integer different than M and is not less than two, during the time said counter makes the round of count operation. Preferably, in the present invention, said row address whose refresh period is subject to change includes a row address output once when said counter makes a plurality of rounds of count operations.

In the present invention, the counter output may be output as refresh address in the next cycle to the cycle in which the row address which changes the refresh address and which interrupted the counter output was output.

The semiconductor memory device according to the present invention, preferably includes: at least one set of a storage unit for storing a count value which is to be interrupted by a row address whose refresh period is subject to change, and a comparator circuit for comparing said count value stored in said storage unit and an output of said counter to each other; a holding circuit for setting a hit signal to an active state when a coincidence signal from said comparator circuit is output; said holding circuit resetting said hit signal to an inactive state in the next clock cycle; a circuit for receiving an output of said holding circuit and a refresh clock signal, and for performing control so that, when said hit signal is in an active state, said refresh clock signal is not propagated to said counter to halt the count operation thereof, and so that, when said hit signal is in an inactive state, said refresh clock signal is propagated to said counter; and a circuit for modifying at least a part of said count output of said counter to generate said row address which refresh period is subject to change, when said hit signal is in an active state.

The semiconductor memory device also preferably includes a circuit for modifying at least a part of a count output of the counter when the hit signal is in an active state to generate the row address which refresh period is subject to change.

The semiconductor memory device according to the present invention, preferably includes a storage unit for storing the row address whose refresh period is subject to change, and a comparator circuit for comparing the row address stored in the storage unit and an output of the counter to each other. The comparator circuit includes a first comparator circuit section for comparing an upper bit set of the counter output to an upper bit set of a count value of the storage unit, and a second comparator circuit section for comparing lower bits of the counter output and lower bits of the row address whose refresh period is subject to change to each other. The semiconductor memory device also preferably includes a coincidence decision circuit for giving a decision for coincidence when the result of comparison by the first comparator circuit section indicates non-coincidence and the result of comparison by the second comparator circuit section indicates coincidence, and a holding circuit for setting an output hit signal to an active state responsive to the result of coincidence decision by the coincidence decision circuit and for resetting the hit signal to an inactive state in the next following clock cycle. The semiconductor memory device also preferably includes a circuit supplied with an output of the holding circuit and with a refresh clock signal, and adapted for performing control so that, when the hit signal is in an active state, the refresh clock signal is not propagated to the counter, thereby halting the counter operation, and so that, when the hit signal in an inactive state, the refresh clock signal is propagated to the counter. The semiconductor memory device preferably includes a circuit for modifying at least a part of an output of the counter when the hit signal is in an activate state to generate the row address whose refresh period is subject to change.

In the semiconductor memory device according to the present invention, the circuit generating the row address whose refresh period is subject to change preferably includes a selector circuit which is supplied with the hit signal as a selection control signal and which outputs an upper bit set of the counter when the hit signal is in an inactive state. When the hit signal is in an activate state, the selector circuit outputs an upper bit set of the row address whose refresh period is subject to change, stored in the storage unit and determined to be coincident with the counter output.

According to the present invention, the semiconductor memory device preferably includes a plurality of sets each composed of a comparator circuit, made up by the first comparator circuit section and the second comparator circuit section, and of a storage unit, and a circuit for generating a first comparison result signal, based on a logical sum of the plural first comparator circuit sections, to supply a first comparison result signal generated to the holding circuit. The semiconductor memory device also preferably includes a circuit for generating a second comparison result signal, based on a logical sum of the plural second comparator circuit sections, to supply the second comparison result signal generated to the holding circuit. The coincidence decision circuit gives a decision for coincidence when the first comparison result signal indicates non-coincidence and the second comparison result signal indicates coincidence.

According to the present invention, the upper bit set may be the most significant bit of the counter output and the lower bits may be the counter output other than the most significant bit. Or, the upper bit set may be a preset number of upper bits of the counter output as counted from the MSB side, and the lower bits may be the counter output other the upper bits.

The semiconductor memory device according to the present invention, preferably includes: a storage unit for receiving an output of said counter as an address, said storage unit storing in a cell thereof to be accessed by said address information indicating whether said counter output is to be interrupted by said row address which refresh period is subject to change or to be directly output as a refresh address; a holding circuit for setting a hit signal to an active state when said information indicates that an output of said storage unit is to be interrupted by said row address which refresh period is subject to change and for resetting said hit signal to an inactive state in the next following clock cycle; a circuit for receiving an output of said holding circuit and a refresh clock signal and for performing control so that, when said hit signal is in an active state, said refresh clock signal is not propagated to said counter to halt the count operation thereof, and so that, when said hit signal is in an inactive state, said refresh clock signal is propagated to said counter; and a circuit for modifying at least a part of the count output of said counter to generate said row address which refresh period is subject to change, when said hit signal is in an activate state.

According to the present invention, the semiconductor memory device preferably includes: a storage unit for receiving an output of said counter as an address, said storage unit storing in a cell thereof to be accessed by said address information as to whether said counter output is to be directly output as a refresh address or is to be replaced by said row address which refresh period is subject to change, and bit manipulation information specifying the operation on bits in order to effect bit replacement if such bit replacement is to be made; a coincidence decision circuit for outputting a coincidence signal in case an output of said storage unit indicates that said counter output is to be replaced by said row address which refresh period is subject to change; a holding circuit for setting an output hit signal to an active state, when said coincidence decision circuit makes a decision for coincidence, and for resetting said hit signal to an inactive state in the next following clock cycle; a circuit for receiving said hit signal output from said holding circuit and a refresh clock signal; said circuit performing control so that, when said hit signal is in an active state, said refresh clock signal is not propagated to said counter to halt the count operation thereof, and so that, when said hit signal is in an inactive state, said refresh clock signal is propagated to said counter; and a circuit for executing bit-manipulation on the counter output and changing at least a part thereof, based on said bit manipulation information output from said storage unit, to generate said row address which refresh period is subject to change.

According to the present invention, the semiconductor memory device preferably includes: a storage unit for receiving an output of said counter as an address, said storage unit storing in a cell thereof to be accessed by said address the first information as to whether or not said counter output is to be replaced by said row address which refresh period is subject to change and the second information as to whether or not refresh having an output of said counter as a refresh address is to be skipped over; a holding circuit for setting an output hit signal to an active state based on the first and second information output from said storage unit and for setting the hit signal in an inactive stat en the next following clock cycle; a circuit for receiving said hit signal output from said holding circuit and a refresh clock signal; said circuit performing control so that, when said hit signal is in an active state, said refresh clock signal is not propagated to said counter to halt the count operation thereof, and so that, when said hit signal is in an inactive state, said refresh clock signal is propagated to said counter; a circuit for halting the refresh operation based on said second information output from said storage unit and on a preset bit signal of said counter output to halt the refresh operation; and a circuit for modifying at least a part of said counter output to generate said row address which refresh period is subject to change, when said hit signal is in an activate state.

A method according to another aspect of the present invention is a method for refresh control of a semiconductor memory device in need of a refresh operation for data retention, which comprises the steps of:

generating a refresh address;

deciding on whether or not said refresh address generated corresponds to an address interrupted by said row address whose refresh period is subject to change; and performing control for interrupting said generated refresh address to output said row address whose refresh period is subject to change, if the result of decision indicates that the generated refresh address is the address to be interrupted by said row address whose refresh period is subject to change.

The refresh controlling method according to the present invention, comprises the steps of:

deciding on whether or not said generated refresh address corresponds to an address for which refreshing is to be skipped over for the present time; and skipping over the refreshing of said generated refresh address in case the results of decision indicate that said generated refresh address corresponds to an address for which refreshing is to be skipped over.

Preferably, in the refresh controlling method according to the present invention, said row address which refresh period is subject to change is output a plural number of times as said counter makes the round of count operation.

Preferably, in the refresh controlling method according to the present invention, said row address which refresh period is subject to change at least includes a row address output M times, where M is an integer not less than two, and a row address output N times, where N is an integer not less than two different than said M.

Preferably, in the refresh controlling method according to the present invention, said row address which refresh period is subject to change includes the row address output once as said counter makes the round of count operation.

Preferably, in the refresh controlling method according to the present invention, said counter output is output as a refresh address in the clock cycle next following the cycle in which the row address which interrupted said counter output and which changes said refresh period was output as refresh address.

The meritorious effects of the present invention are summarized as follows.

According to the present invention, memory cells with the short refresh period may adequately be relieved without the risk of the sense noise being increased even if the refresh period is set to a shorter time.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 5 is a diagram showing the configuration and the operation of a third embodiment of the present invention.

FIG. 6A shows the configuration of a fourth embodiment of the present invention and FIGS. 6B and 6C are schematic views for illustrating its operation.

FIG. 10A is a timing chart for illustrating the configuration of the sixth embodiment of the present invention and FIGS. 10B to 10D illustrate its operation.

PREFERRED EMBODIMENTS OF THE INVENTION

Figure 1:
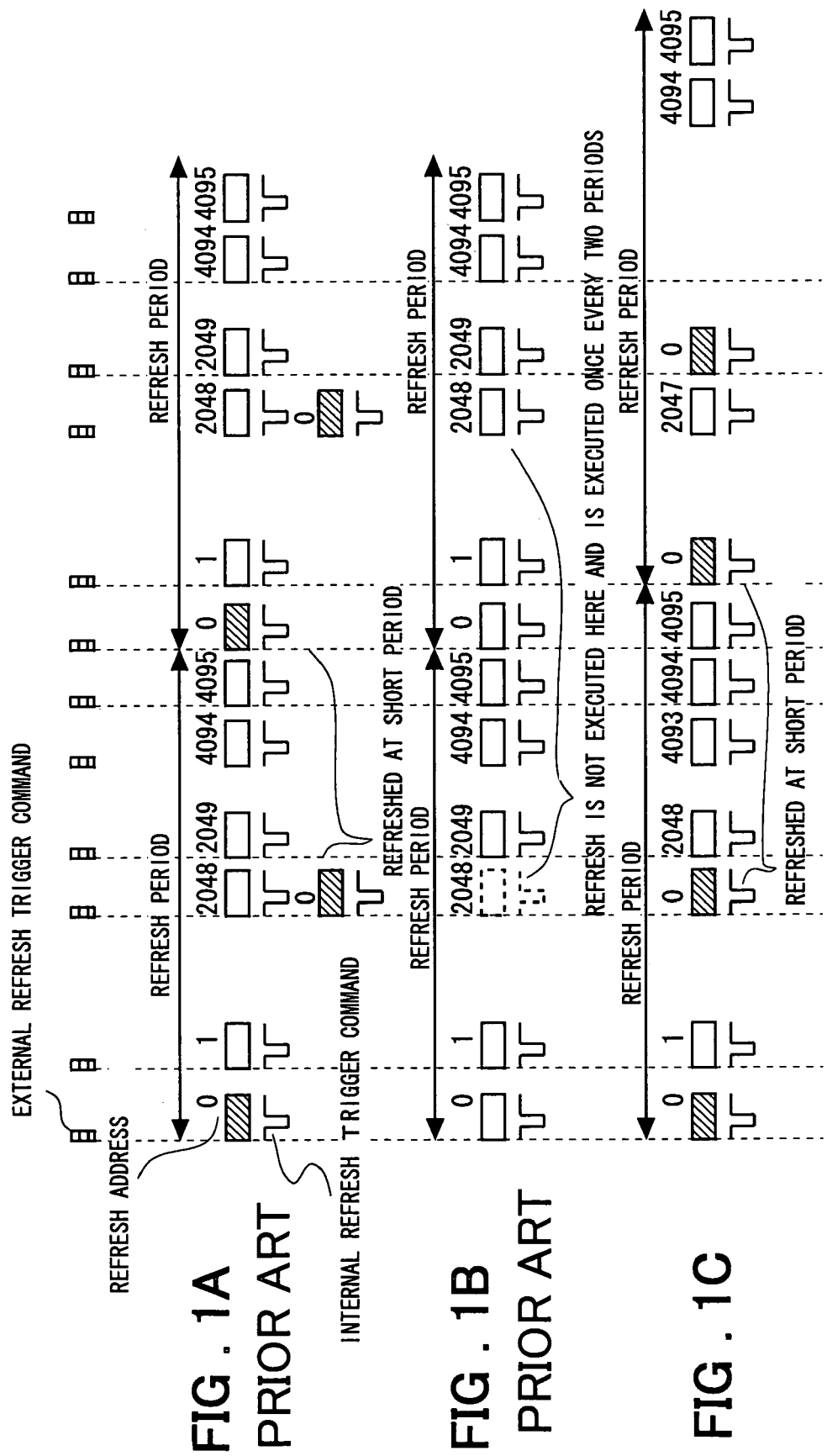
FIGS. 1A and 1B are timing diagrams for illustrating conventional refresh control and FIG. 1C is a timing diagram for illustrating refresh control of the present invention.

Preferred embodiments of the present invention will be described with reference to the accompanying drawings. The present invention is configured to execute refreshing of a refresh address from a refresh counter with a next refresh trigger command and to cause refreshing of a row address with a short refresh period to break in, as shown in FIG. 1C. The present invention includes means for storing, in association with the count value of a refresh counter, the information as to whether an output of the refresh counter corresponds to an address to be interrupted by the row address whose refresh period is subject to change, and means for controlling to output the row address whose refresh period is subject to change, as a refresh address, in case the counter output corresponds to the address to be interrupted by the row address whose refresh period is subject to change. The refresh period of a row address, having a shorter data retention time, is set to be shorter than the normal period.

According to the present invention, no two ROW addresses are refreshed simultaneously for an external refresh trigger command supplied from outside, so that the noise generated at the time of sense operation is approximately equal to that for normal refresh.

If extra N row addresses for refreshing are squeezed into one round of the address counter, the refresh period is extended by N periods. Taking an example of a memory, in which 4096 refresh trigger commands are executed in 64 ms, the actual refresh period is 64 ms+(64 ms/4096)*N.

In case extra 100 row addresses, for example, are squeezed into one round of the address counter, for example, during the period the counter value is counted up from 0 to 4095, the refresh period is extended from 64 ms only to 65.5 ms. However, the effect of the refresh period elongation of this extent is small or negligible.

On the other hand, it is unnecessary to generate a clock signal having a clock period adjusted in order for even the cells with the shortest refresh period to hold data in contradistinction from Patent Document 2. A cell with a short refresh period (data retention time) may be relieved with the use of, for example, a refresh trigger command from the controller.

Alternatively, with the present invention, control may be performed so that refresh is omitted for a certain row address so that the row address so omitted for refresh becomes longer in the refresh period. Or, certain plural row addresses may be refreshed with refresh periods which are shorter than the normal period and which are of differing lengths. The present invention will now be described with reference to preferred embodiments.

Figure 2:
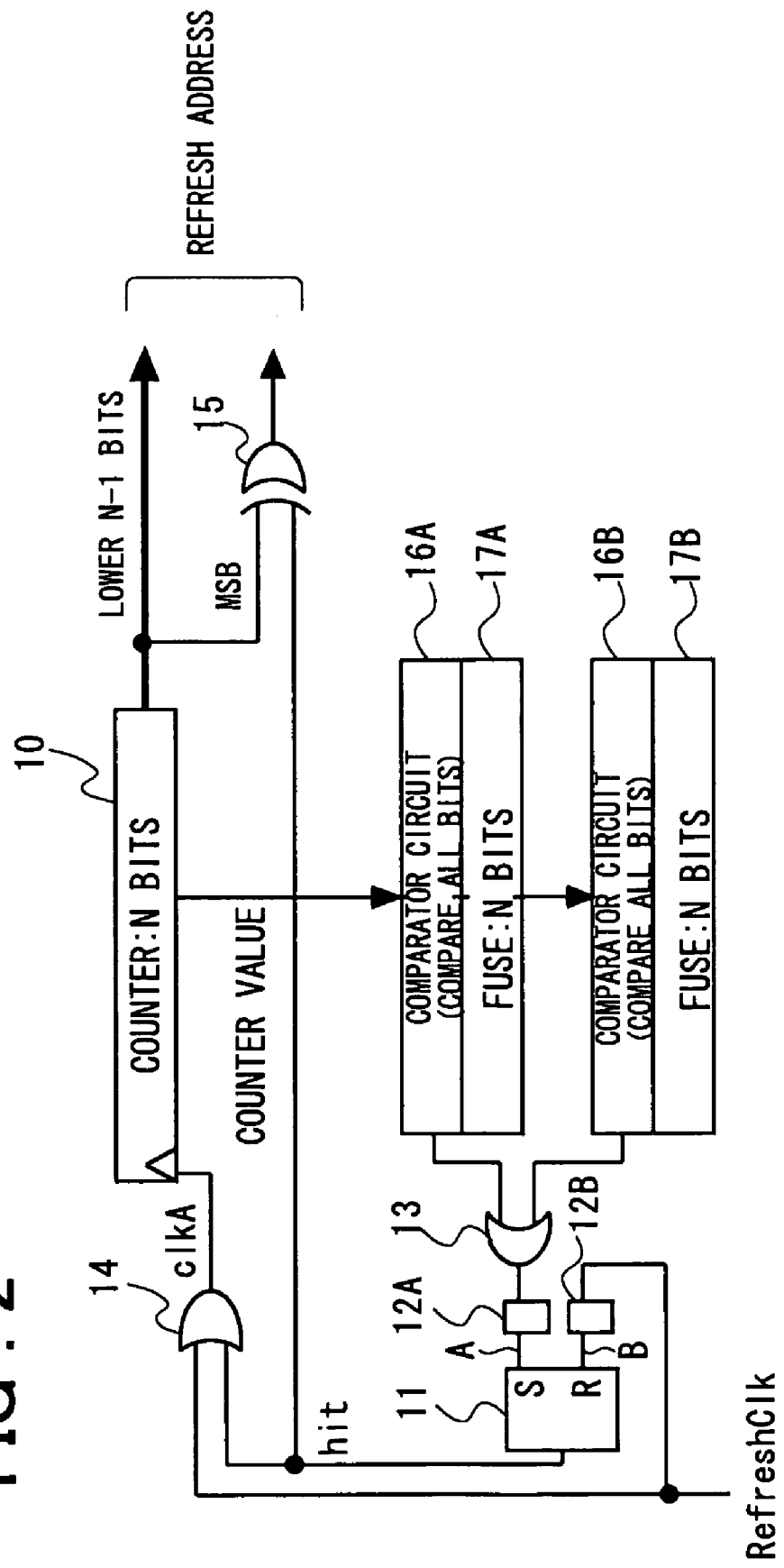
FIG. 2 is a diagram showing the configuration of a first embodiment of the present invention.

A first embodiment of the present invention will now be described. FIG. 2 is a diagram showing the configuration of a first embodiment of the present invention. It should be noted that FIG. 2 shows the configuration of a circuit for controlling the generation of refresh address but does not show cell array components, such as memory cell array, X-decoder, Y-decoder or sense amplifiers, or address buffers. Referring to FIG. 2, the first embodiment of the present invention includes a refresh counter 10, a SR latch circuit 11(also termed an SR flip-flop), pulse generating circuits 12A and 12B, OR circuit 13, a logic circuit 14, a logic circuit 15, comparator circuits 16A and 16B, and programmable fuse data 17A and 17B. The refresh counter 10 performs count operation in synchronization with a clock signal ClkA which is used as a refresh clock signal and have a count output of N bits. The programmable fuse data 17A and 17B specify addresses to be interrupted. The comparator circuits 16A and 16B compares a count output (count value) from the refresh counter 10 with the fuse data 17A and 17B, respectively. The OR circuit 13 performs logically sum operation of outputs of the comparator circuits 16A and 16B to output the result as being the result of comparison carried out by the comparator circuits 16A and 16B. The SR latch circuit 11 and pulse generating circuits 12A and 12B compose a circuit for holding the refresh signal for one period of the refresh clock signal. The SR latch circuit 11 is adapted to hold a coincidence signal from the OR circuit 13 for a time interval corresponding to one period of the refresh clock signal, in case such coincidence signal is output from the OR circuit 13. The logic circuit 14 performs control for stopping the supply of the refresh clock signal clkA to the refresh counter 10 in case the coincidence signal (hit) output from the one period holding circuit (SR latch circuit 11) is in an activate state. The logic circuit 15 for inverting the MSB (Most Significant Bit) of the output of the refresh counter 10 for outputting the result as a refresh address. The fuse data 17A and 17B constitute a ROM each storing a binary value responsive to for example the fuse being blown off or being connected, and are also termed a fuse ROM. The pulse generating circuit 12A is responsive to a rising edge from LOW to HIGH of an output of the OR circuit 13, and outputs the result of comparison, to generate a one-shot pulse, and the pulse generating circuit 12B is responsive to a rising edge from LOW to HIGH of a refresh clock signal RefreshClk to generate a one-shot pulse. The SR latch is responsive to an output from the pulse generating circuit 12A at its set terminal and sets the hit signal to a HIGH level (activated state) when the result of comparison by the comparator circuits indicates coincidence. The SR latch is also responsive to an output of the pulse generating circuit 12B at its reset terminal to reset the hit signal to a LOW level with the rising edge from LOW to HIGH of a refresh clock signal RefreshCLK. Meanwhile, the refresh clock signal RefreshClk is generated based on a trigger signal which is generated responsive to a command supplied from outside or which is generated on timeout of a timer (refresh period), not shown.

In the present embodiment, the circuit 14 is constituted by an OR circuit. When the hit signal is at a HIGH level (in the activated state), the refresh clock signal (RefreshClk) is not transferred to the counter 10 and halts the count operation of the counter 10. When the hit signal is at the LOW level (activated state), the refresh clock signal (RefreshClk) is directly output as clkA and is supplied to the counter 10. The logic circuit 15 is constituted by an exclusive-OR (EXOR) circuit and, when the hit signal is at the HIGH level, the circuit 15 inverts the MSB to output the so inverted bit. When the hit signal is at the LOW level, the circuit 15 outputs the MSB unchanged.

Figure 3A:
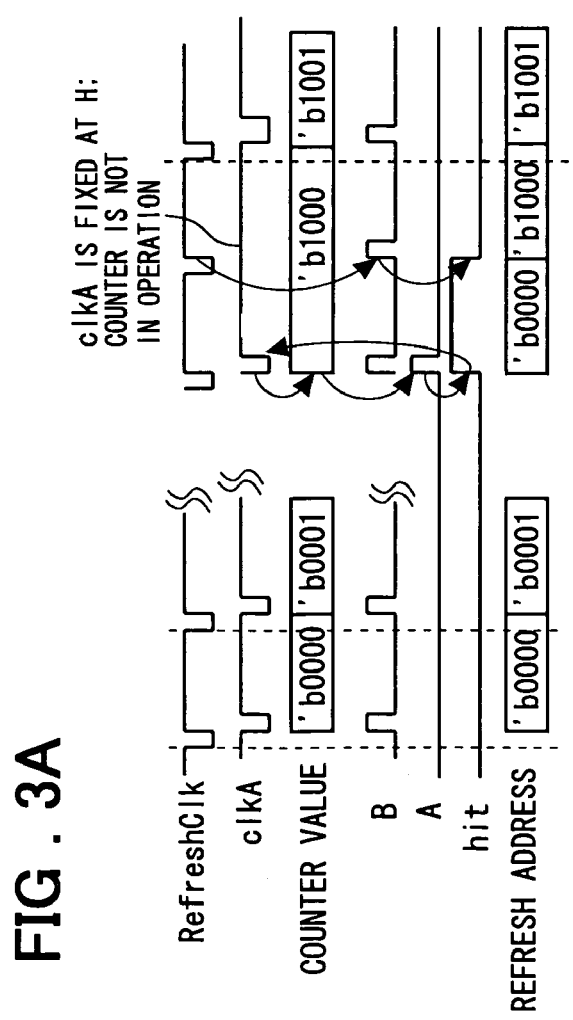
FIGS. 3A, 3B and 3C are views illustrating the operation of a first embodiment of the present invention.
Figure 3B:
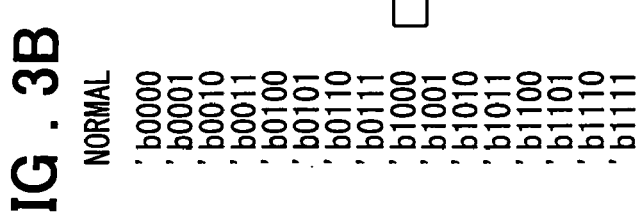
Figure 3C:
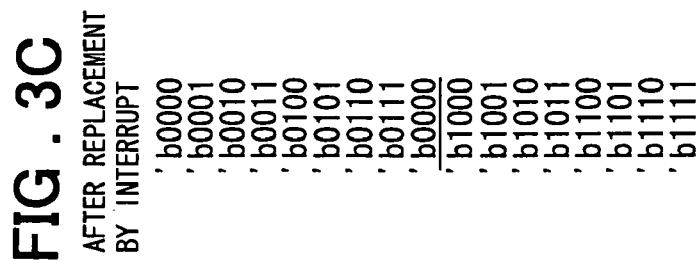

FIGS. 3A to 3C schematically illustrate the operation of the circuit of the present embodiment. FIG. 3A schematically shows the waveforms of the timing operation. For simplifying the operation, let 'b0000, where 'b denotes binary, be a row address with a short refresh period, as data in the 4-bit counter 10, and let a row address to be interrupted be specified as 'b1000, which is stored as fuse data. It is noted that, since a row address with a short refresh period is connected to a word line associated with the row address, the refresh period for the row address is set to be one-half a normal period, as an example. That is, the row address 'b1000 is interrupted by the row address 'b0000.

When the output (count value) of the counter 10 becomes 'b1000, an output of the OR circuit 13 becomes HIGH, so that the pulse generating circuit 12A outputs a pulse A. An output signal hit of the SR latch circuit 11 becomes HIGH so that the clock signal clkA also becomes HIGH to cause the counter 10 to be halted. The EXOR circuit 15 inverts the most significant bit (MSB) '1' of the counter 10 and outputs '0' as a MSB of the refresh address. As a result, 'b0000 becomes a refresh address in place of 'b1000. In the next cycle (at the rising edge of the refresh clock signal RefreshClk), a one-shot pulse B is output to set the output signal hit of the SR latch circuit 11 to a LOW level. The EXOR circuit 15 outputs the MSB of the counter output, so that the count value in the halted state 'b1000 becomes the refresh address.

When, with the output hit of the SR latch circuit 11 in the LOW state, the refresh clock signal RefreshClk undergoes a rise transition, the counter 10 increments the count value by one so that 'b1001 becomes the refresh address.

FIGS. 3B and 3C show a sequence of the four-bit refresh address for the normal operation and a sequence of the four-bit refresh address following the replacement caused by interrupt. In the normal operation, the address 'b0111 is followed by 'b1000. After the replacement by the interrupt, the address 'b0111 is followed by 'b0000, which is followed in turn by 'b1000, so that the total cycles is 17. In the present embodiment, the row address 'b0000 is refreshed with a refresh period in which this row address is output twice during the time the counter 10 makes one round, that is, with a refresh period which is one-half of the normal period.

Although two sets of combinations of the fuse data and the comparator circuits are shown in FIG. 2, only one set of the fuse data and the comparator circuits may also be used, in which case the OR circuit 13 may be omitted. Of course, three or more sets of the combinations of the fuse data and the comparator circuits may also be used.

Figure 4:
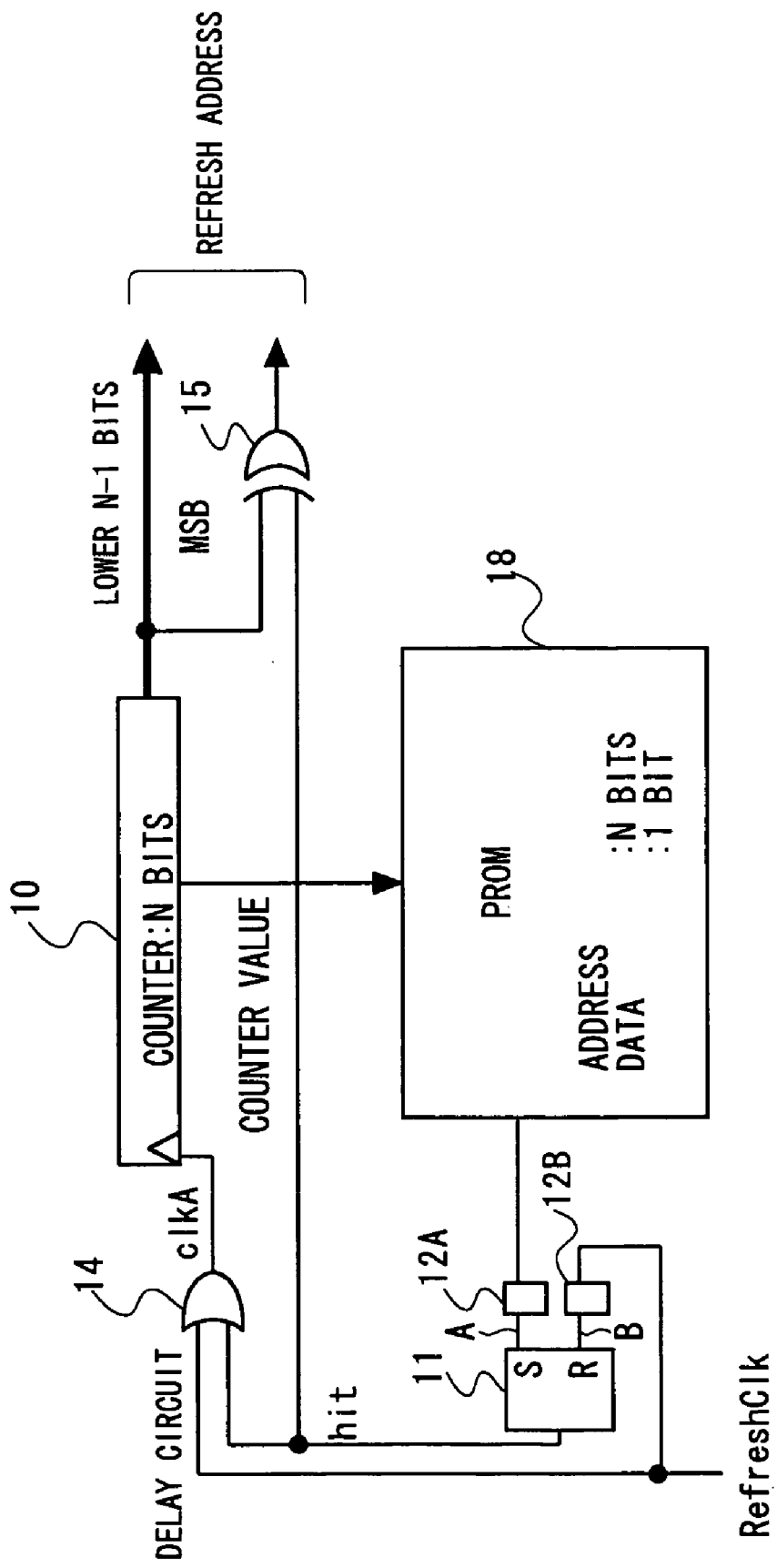
FIG. 4 is a diagram showing the configuration of a second embodiment of the present invention.

A second embodiment of a second embodiment of the present invention will now be described. FIG. 4 is a diagram showing the configuration of the second embodiment of the present invention. Referring to FIG. 4, a programmable ROM (PROM) 18 is used in place of the combination of the fuse data and the comparator circuits. In this PROM 18, '1' is recorded for an address to be interrupted and '0' is recorded for other addresses. The PROM 18 receives an output count value from the counter 10 which corresponds to a refresh address, and outputs data of '1' or '0', depending on whether or not the count value corresponds to an address to be interrupted. If the count value corresponds to the address to be interrupted, the SR latch circuit 11 sets the hit signal to HIGH level and holds the hit signal at the HIGH level for one period until a rise transition of the next refresh clock signal RefreshClk. If data '1' is written in an address of 'b1000 of the PROM 18, the operation of the present embodiment is similar to the operation shown in FIG. 2. With the present embodiment, the comparator circuits 16A and 16B of the above-described embodiment are unneeded. The present embodiment is effective when there are many addresses to be interrupted.

A third embodiment of the present invention will now be described. FIG. 5 is a diagram showing the configuration of the third embodiment of the present invention. Referring to FIG. 5, the present embodiment includes a refresh counter 10, which is synchronized with a clock signal clkA which is used as a refresh clock signal, a plural number of programmable fuse data 17A and 17B which are for specifying interrupt addresses, and comparator circuits 16A-1 and 16B-1 and comparator circuits 16A-2 and 16B-2. In comparing count values of the refresh counter 10 with the fuse data 17A and 17B, the comparator circuits 16A-1 and 16B-1 output the results of comparison of the most significant bits (comparison of MSBs), while the comparator circuits 16A-2 and 16B-2 output the results of comparison of the other bits. The present embodiment also includes an OR circuit 22A for logically summing the outputs of the comparator circuits 16A-1 and 16B-1 to output a first result of comparison, and an OR circuit 22B for logically summing the outputs of the comparator circuits 16A-2 and 16B-2 to output a second result of comparison. The present embodiment also includes a coincidence decision circuit 21 for outputting a coincidence signal in case the second result of comparison indicates coincidence and the first result of comparison indicates non-coincidence, and a one-period holding circuit 20 for holding the result of comparison of the coincidence decision circuit 21 for one period of the refresh clocks. The present embodiment also includes a logic circuit 14 for performing control for halting the supply of the refresh clock signal to the refresh counter 10 responsive to the result of the holding of the one-period holding circuit 20. The present embodiment further includes selector circuits 23 and 24 for replacing the most significant bit of the fuse data with the most significant bit of the refresh address to output the resulting data.

The difference between the present embodiment and the above-described first embodiment is that, in the first embodiment, the MSB of the output of the counter 10 is inverted by the EXOR circuit 15, whereas, in the present embodiment, data changeover is made by the selector circuit 24. As for the timing operation of the present embodiment, reference is made to FIG. 3A, as in the above-described first embodiment.

Assuming that in the 4-bit counter, 'b0000 is an address with a short refresh period, an interrupt address 'b0000 is stored as fuse data. When the counter data value becomes 'b1000, the two data are non-coincident as to the most significant bit and coincident as to the other bits. The coincidence decision circuit 21 gives a decision for coincidence, and hence the output signal hit of the one-period holding circuit 20 becomes HIGH. The counter 10 halts its count operation. The most significant bit '0' of the fuse data is selected by the selector circuit 23. The selector circuit 24 receives the output signal hit of the one-period holding circuit 20 as selection control signal and, if the signal hit is HIGH, the selector 24 selects the output of the selector 23, which output is substituted for the most significant bit of the refresh address. As a result, 'b0000 becomes the refresh address to take the place of 'b1000. In the next cycle, 'b1000 becomes the refresh address. In the present embodiment, as in the previous first embodiment, the number of the sets of the comparator circuits and the fuse data may be one or not less than three, as desired. The selector 23 outputs the most significant bit of the fuse data, in the set of the fuse data and the comparator circuits, determined to be coincident, that is, determined to be hit, by the coincidence decision circuit 21. If there is only one set of the comparator circuits and the fuse data, the selector 23 is omitted.

Meanwhile, if, in the above-described first embodiment, 'b0000 is an address with a short refresh period, it is output twice during one circulation of the counter 10, with the refresh period of the address being one-half the normal period. However, this refresh period may be reduced to one-fourth.

FIG. 6A is a diagram showing the constitutions of a fourth embodiment of the present invention. FIGS. 6B and 6C are diagram for explaining the operation of the fourth embodiment of the present invention. Referring to FIGS. 6A, 6B and 6C, the present embodiment includes a refresh counter 10, which is synchronized with a clock signal clkA which is used as a refresh clock signal, and a plural number of programmable fuse data 17A and 17B which are for specifying interrupt addresses, comparator circuits 16A-3 and 16B-3 and comparator circuits 16A-4, and 16B-4. In comparing the count values of the refresh counter 10 with the fuse data, the comparator circuits 16A-3 and 16B-3 output the results of comparison of the MSBs and the next higher order bits, while the comparator circuits 16A-4 and 16B-4 output the results of comparison of the lower N-2 bits, respectively. The present embodiment also includes an OR circuit 22A for taking a logical sum of the outputs of the comparator circuits 16A-3 and 16B-3 to output a first result of comparison, and an OR circuit 22B for logically summing the outputs of the comparator circuits 16A-4 and 16B-4 to output a second result of comparison. The present embodiment also includes a coincidence decision circuit 21 for outputting a coincidence signal in case the second result of comparison indicates coincidence and the first result of comparison indicates non-coincidence, and a one-period holding circuit 20 for holding the result of comparison of the coincidence decision circuit 21 for one period of the refresh clocks. The present embodiment also includes a logic circuit 14 for performing control for halting the supply of the refresh clock signal clkA to the refresh counter 10 responsive to the result of the holding of the one-period holding circuit 20. Additionally, the present embodiment includes selector circuits 23' and 24' which are for replacing the MSB and the next upper bit of the fuse data with the MSB and the next upper bit of the refresh address to output the resulting data. If, as 4-bit data of the counter 10, 'b0000 is a row address for which refresh needs to be carried out at a ¼ period, the row address information 'b0000 with the ¼ period is stored as fuse data.

Each time when the counter value becomes 'b1000, 'b1100 and 'b0100, the signal hit becomes HIGH, and the operation of the counter 10 is halted. The upper two bits of the fuse data 'b00 replace the upper two bits of the refresh address so that 'b0000 becomes the refresh address in place of the 'b1000, 'b1100 and 'b0100. In the next following cycles, the original addresses 'b1000, 'b1100 and 'b0100 become refresh addresses respectively.

If, in the above-described first embodiment, the refresh period is set to be one-fourth of the normal period, it is necessary to set three fuse data. In the present embodiment, it suffices to set only one fuse data.

In similar manner, in the embodiment provided with a PROM, shown in FIG. 4, the refresh period of the row address with short data retention time may be set to approximately one-fourth of the normal period. Shown below is a fifth embodiment of the present invention having this constitution.

Figure 7:
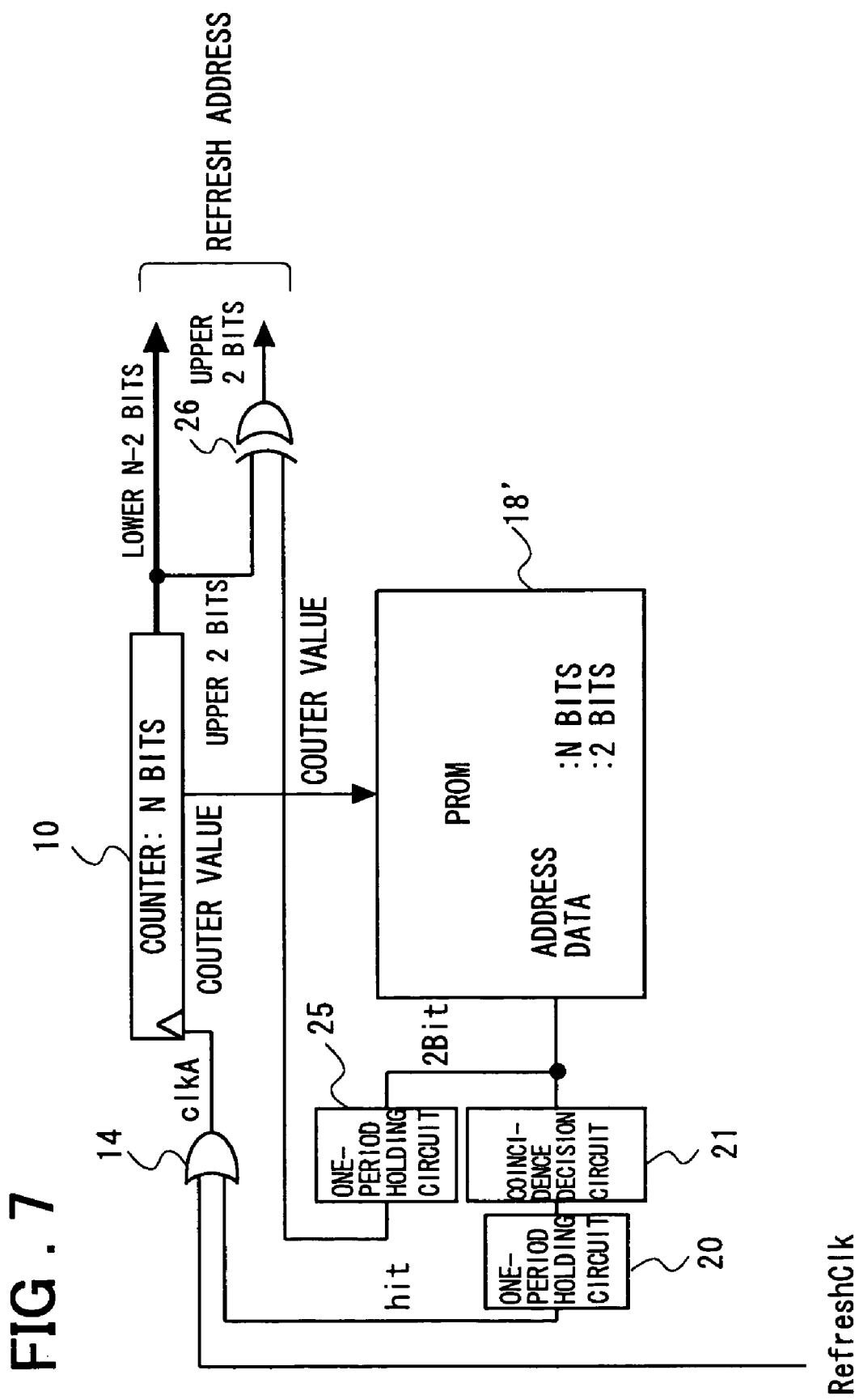
FIG. 7 is a diagram showing the configuration of a fifth embodiment of the present invention.
Figure 8:
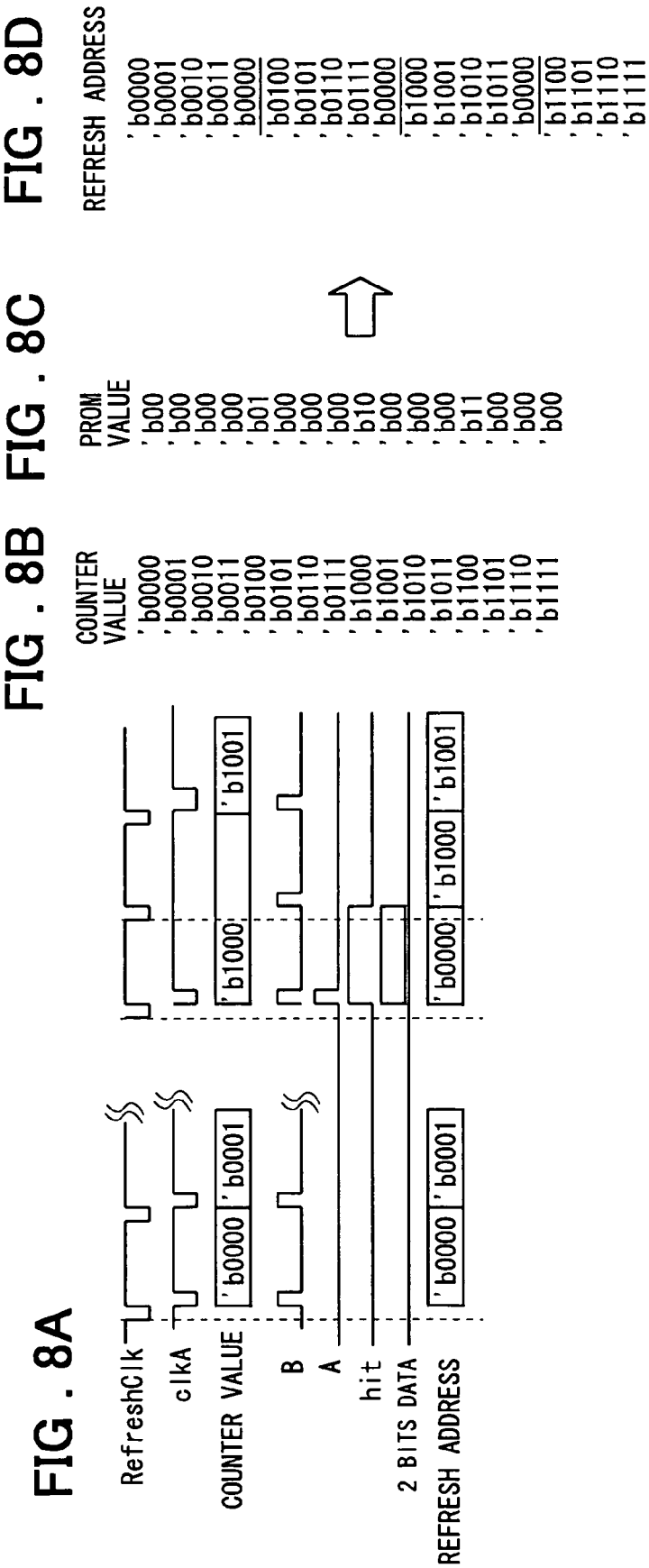
FIG. 8A is a timing chart for illustrating the configuration of the fifth embodiment of the present invention and FIGS. 8B to 8D illustrate its operation.

FIG. 7 is a circuit diagram showing the configuration of a fifth embodiment of the present invention. FIGS. 8A, 8B, 8C and 8D illustrate the operations of the fifth embodiment of the present invention. Referring to FIG. 7, the present embodiment includes a refresh counter 10, which is synchronized with a clock signal clkA, used as refresh clocks, a PROM 18' for 2-bit data, a decision circuit 21 for deciding on coincidence from the 2-bit data of the PROM 18", a circuit 20 for holding the results of comparison for one period of the refresh clocks, and a circuit 14 for halting the supply of the refresh clocks to the refresh counter responsive to the data holding. The present embodiment further includes a circuit 25 for holding the 2-bit data for one period of the refresh clocks and a circuit 26 for inverting the upper two bits of the counter 10 to output the resulting data. The circuit 26 is made up of two exclusive-OR (EXOR) circuits for performing EXOR operations on the two bit output of the circuit 25 which holds the two bits for one clock period and the upper two bits of the counter 10, on the bit-by-bit basis and for outputting two bits.

As two-bit data of the PROM 18', '00' denotes no interrupt, '01' denotes inversion of the second upper bit, '10' denotes inversion of the MSB and '11' denotes inversion of upper two bits.

If the PROM 18' is read out, with the counter values as addresses, and the result is '01', '10' or '11', the coincidence decision circuit 21 gives a decision for coincidence. The one-period holding circuit 25 outputs a HIGH level hit signal to generate an interrupt. For simplicity of explanation, assume that the counter is a 4-bit counter, and 'b0000 is an address with a short refresh period, the Prom 18' holds '10', '01' and '11' in addresses 'b1000, 'b0100 and 'b1100, respectively.

When the counter values become 'b1000, 'b1100 and 'b0100, the operation of the counter 10 is halted and respective upper two bits are inverted in accordance with data of the PROM 18' as held on the one-period holding circuit 25, so that 'b0000 becomes the refresh address to take the place of 'b1000, 'b0100 and 'b0100. In the next cycles, the original addresses 'b1000, 'b0100 and 'b0100 become refresh addresses, respectively.

By using three bits or four bits, in place of the two bits, the refresh period may be extended to a 1/N period. In the present embodiment, the period of the refresh address, in which the same refresh address is output N times during the time the counter performs one rotation, is termed a 1/N period.

If, in the above-described 4-bit row address (refresh address), 'b1100' and 'b0100 is '00' data, the refresh period becomes a one-half period of the normal refresh period, such that the one-half refresh period and the one-fourth refresh period may co-exist.

Figure 9:
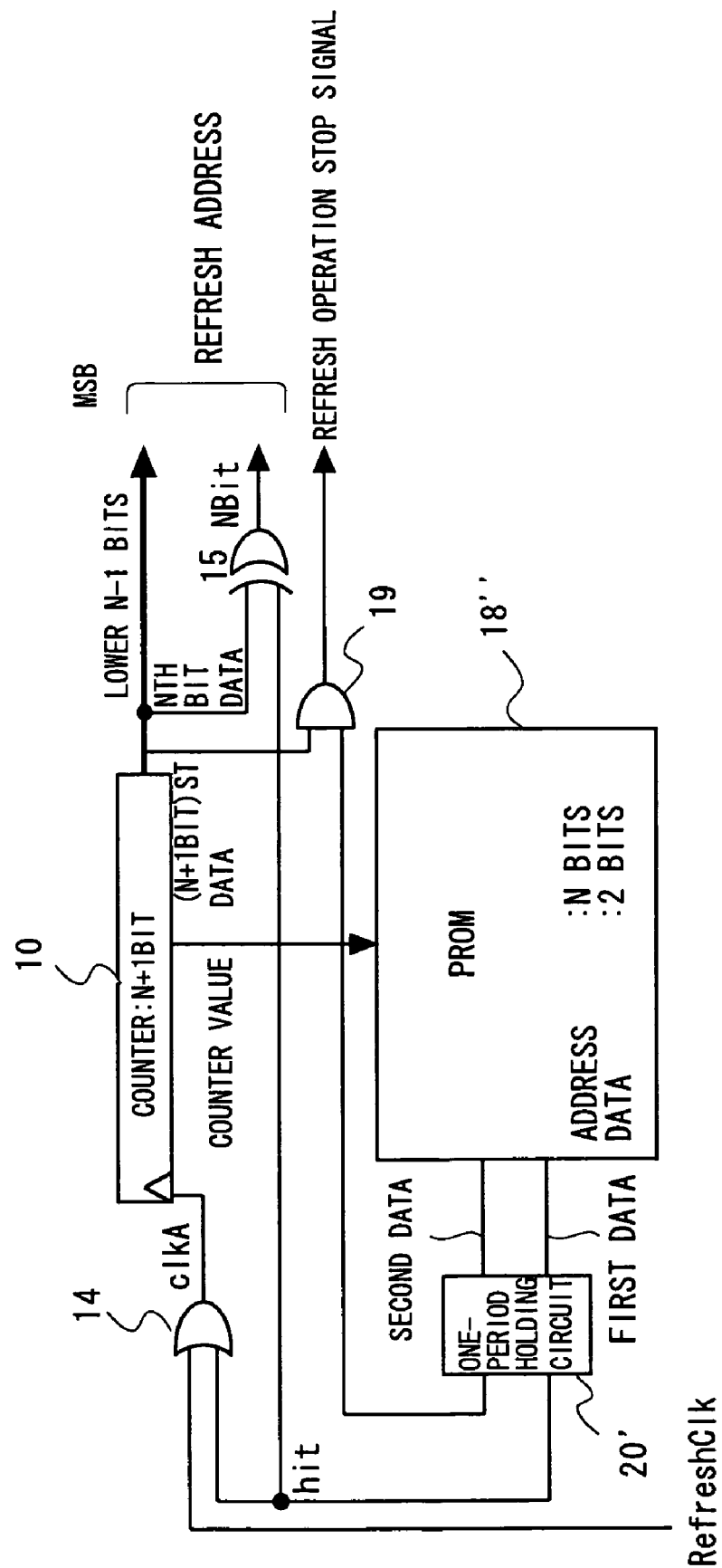
FIG. 9 is a diagram showing the configuration of a sixth embodiment of the present invention.

In the above-described embodiments, the refresh period is shorter than the normal period. However, the refresh period may be longer than the normal period. FIGS. 9 and 10 illustrate the configuration and the operation of a sixth embodiment of the present invention, respectively. In the present sixth embodiment, a refresh period which is twice the normal refresh period and a refresh period which is one-half the normal refresh period co-exist.

Referring to FIG. 9, the present embodiment includes an N+1 bit refresh counter 10, which is synchronized with a refresh clock signal, with a refresh address being formed by N bits, a 2-bit data PROM 18″, which employs lower N bits of the counter 10 as an address, and a circuit 20′ for holding the 2-bit data during the time corresponding to one period of the refresh clock signal. The present embodiment also includes a circuit 14 for inverting the MSB of the counter depending on one of the two bits (first data), and a circuit 19 for outputting a refresh operation stop signal depending on the other one-bit data (second data) and the count values of the N+1 bits. The circuit 19 is composed by for example an AND circuit.

The refresh address is of N bits, and the counter is a (N+1) bit counter, with the lower N bits of the counter being addresses of the PROM 18″.

The data stored in cells of the PROM 18″ are second data indicating that refresh is to be omitted once; and first data indicating whether or not a ROW address is interrupted, as in the aforementioned second embodiment.

In case the second data is '0', refresh is carried out without dependency on the (N+1)st bit of the counter. In case the second data is '1', a refresh operation stop signal is output in case the (N+1)st bit of the counter is '1', such that no refresh operation is carried out.

If, as shown in FIG. 10A, the second data is '1' (HIGH) and the (N+1)st bit is '1', the refresh operation stop signal from the circuit 19 becomes HIGH, such that no refresh operation is carried out.

The refresh period for the address 'b0100 is a double refresh period, whilst that for the address 'b0000 is a one-half period. Meanwhile, in the present embodiment, the timing operation for the refresh period corresponding to one-half of the normal refresh period is equivalent to the operation of FIG. 3A. Hence, the timing operation for the refresh period corresponding to one-half of the normal refresh period is not shown in FIG. 10A. The operation with the refresh period equal to twice the normal refresh period and the operation with the refresh period equal to one-half the normal refresh period may co-exist in the present embodiment.

The number of cells refreshed for the same refresh trigger command is the same, as described above, so that the increase of noise is suppressed. This feature of the present invention is quite different from Patent Document 1. Not only a refresh period equal to one-half the normal refresh period, but a refresh period equal to one-fourth the normal refresh period becomes possible. In Patent Document 1, the noise is quadrupled if the refresh period is one-fourth the normal refresh period. Moreover, there is no necessity of generating a clock signal having the period adjusted to enable data retention even for cells of the shortest refresh period as is done in Patent Document 2.

According to the present invention, if N row addresses are caused to interrupt in the refresh address sequence, the overall refresh period is prolonged by N periods. In a memory, in which 4096 refresh trigger commands are issued in 64 ms, the effective refresh period is 64 ms+64 ms/4096*N. Thus, with interrupts of 100 row addresses, the effective refresh period is increased from 64 ms to 65.5 ms, so that the effect is negligible.

Although the present invention has been described in the foregoing with reference to the above-described embodiments, the present invention is not limited to the configuration of these embodiments, and a variety of changes or correction that would occur to those skilled in the art may naturally be attempted without departing from the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:

means for generating a refresh address for a memory array including a plurality of cells, each of which needs refreshing for data retention;

means for deciding on whether or not said refresh address generated corresponds to an address to be interrupted by a row address whose refresh period is subject to change; and means for performing control for interrupting the generated refresh address to output said row address whose refresh period is subject to change, if the result of decision indicates that the generated refresh address is the address to be interrupted by said row address whose refresh period is subject to change.

2. The semiconductor memory device according to claim 1, further comprising:

means for deciding on whether or not said generated refresh address corresponds to an address for which refreshing this time is to be skipped over; and means for skipping over the refreshing of said generated refresh address in case the result of decision indicates that said generated refresh address corresponds to an address for which refreshing is to be skipped over.

3. A semiconductor memory device comprising:

a counter for generating a refresh address for a memory array including a plurality of cells, each of which needs refreshing for data retention;

storage means for storing information as to whether or not an output of said counter corresponds to an address to be interrupted by a row address whose refresh period is subject to change in association with a count value;

control means for performing control so that, if the output of said counter corresponds to the address to be interrupted by said row address whose refresh period is subject to change, said counter output is interrupted by said row address whose refresh period is subject to change, and said row address whose refresh period is subject to change is used as a refresh address for said memory array in place of said counter output.

4. The semiconductor memory device according to claim 3, wherein the row address whose refresh period is subject to change is output a plural number of times during the time said counter makes a round of count operation.

5. The semiconductor memory device according to claim 4, wherein said row address whose refresh period is subject to change includes at least a row address output M times, where M is an integer not less than two, and a row address output N times, where N is an integer different than M and is not less than two, during the time said counter makes a round of count operation.

6. The semiconductor memory device according to claim 3, wherein said row address whose refresh period is subject to change includes a row address output once during the time said counter makes a plurality of rounds of count operations.

7. The semiconductor memory device according to claim 3, wherein said counter performs count operation, responsive to a refresh command received or to a trigger signal generated on timeout in a refresh timer.

8. The semiconductor memory device according to claim 3, wherein said counter output is output as a refresh address in a cycle next following the cycle in which the row address whose refresh period is subject to change is output as a refresh address to interrupt said counter output.

9. The semiconductor memory device according to claim 3, further comprising:
at least one set of a storage unit for storing a count value which is to be interrupted by a row address whose refresh period is subject to change, and a comparator circuit for comparing said count value stored in said storage unit and an output of said counter to each other;
a holding circuit for setting an output hit signal to an active state when a coincidence signal from said comparator circuit is output; said holding circuit resetting said hit signal to an inactive state in the next clock cycle;
a circuit for receiving an output of said holding circuit and a refresh clock signal, and for performing control so that, when said hit signal is in an active state, said refresh clock signal is not propagated to said counter to halt the count operation thereof, and so that, when said hit signal is in an inactive state, said refresh clock signal is propagated to said counter; and
a circuit for modifying at least a part of said counter output when said hit signal is in an active state to generate the row address which refresh period is subject to change.

10. The semiconductor memory device according to claim 9, further comprising:
a plurality of sets of said storage units and said comparator circuits; and
a circuit for generating a coincidence signal based on the logical sum of outputs of said plural comparator circuits to supply said coincidence signal generated to said holding circuit.

11. The semiconductor memory device according to claim 3, further comprising:
a storage unit for storing said row address whose refresh period is subject to change;
a comparator circuit for comparing the row address stored in said storage unit and an output of said counter to each other;
said comparator circuit including a first comparator circuit section for comparing an upper bit set of said counter output and an upper bit set of a count value of said storage unit, and
a second comparator circuit section for comparing lower bits of said counter output and lower bits of said row address which refresh period is subject to change;
a coincidence decision circuit for giving a decision for coincidence when the result of comparison by said first comparator circuit section indicates non-coincidence and the result of comparison by said second comparator circuit section indicates coincidence;
a holding circuit for setting an output hit signal to an active state, responsive to the result of coincidence decision by said coincidence decision circuit and for resetting said hit signal to an inactive state, in the next following clock cycle;
a circuit for receiving said hit signal output from said holding circuit and a refresh clock signal and for performing control so that, when said hit signal in an active state, said refresh clock signal is not propagated to said counter to halt the count operation thereof, and so that, when said hit signal is in an inactive state, said refresh clock signal is propagated to said counter; and
a circuit for modifying at least a part of said count output of said counter when said output hit signal is in an activate state to generate said row address which refresh period is subject to change.

12. The semiconductor memory device according to claim 11, wherein
said circuit generating the row address which refresh period is subject to change includes a selector circuit; said selector circuit receiving said hit signal as a selection control signal and outputting an upper bit set of said counter output when said hit signal is in an inactive state; said selector circuit outputting, when said hit signal is in an activate state, an upper bit set of said row address whose refresh period is subject to change, stored in said storage unit and determined to be coincident.

13. The semiconductor memory device according to claim 11, further comprising:
a plurality of sets each composed of said comparator circuit, made up by said first comparator circuit section and said second comparator circuit section, and of said storage unit;
a circuit for generating a first comparison result signal, based on a logical sum of said plural first comparator circuit sections, to supply said first comparison result signal generated to said holding circuit; and
a circuit for generating a second comparison result signal, based on a logical sum of said plural second comparator circuit sections, to supply said second comparison result signal generated to said holding circuit;
said coincidence decision circuit for giving a decision for coincidence when said first comparison result signal indicates non-coincidence and said second comparison result signal indicates coincidence.

14. The semiconductor memory device according to claim 11, wherein said upper bit set is the most significant bit of the counter output and said lower bits comprises the counter output other than said most significant bit.

15. The semiconductor memory device according to claim 11, wherein said upper bit set is comprised of a preset number of upper bits of the counter output as counted from the MSB side and said lower bits comprises the counter output other than said upper-bits.

16. The semiconductor memory device according to claim 3, further comprising:
a storage unit for receiving an output of said counter as an address, said storage unit storing in a cell thereof to be accessed by said address information indicating whether said counter output is to be interrupted by said row address which refresh period is subject to change or to be directly output as a refresh address;
a holding circuit for setting a hit signal to an active state when said information indicates that an output of said storage unit is to be interrupted by said row address which refresh period is subject to change and for resetting said hit signal to an inactive state in the next following clock cycle;

a circuit for receiving an output of said holding circuit and a refresh clock signal and for performing control so that, when said hit signal is in an active state, said refresh clock signal is not propagated to said counter to halt the count operation thereof, and so that, when said hit signal in an inactive state, said refresh clock signal is propagated to said counter; and a circuit for modifying at least a part of said counter output to generate said row address which refresh period is subject to change, when said hit signal is in an activate state.

17. The semiconductor memory device according to claim 3, further comprising:

a storage unit for receiving an output of said counter as an address, said storage unit storing in a cell thereof to be accessed by said address information as to whether said counter output is to be directly output as a refresh address or is to be replaced by said row address which refresh period is subject to change, and bit manipulation information specifying the operation on bits in order to effect bit replacement if such bit replacement is to be made;

a coincidence decision circuit for outputting a coincidence signal in case an output of said storage unit indicates that said counter output is to be replaced by said row address which refresh period is subject to change;

a holding circuit for setting an output hit signal to an active state, when said coincidence decision circuit makes a decision for coincidence, and for resetting said hit signal to an inactive state in the next following clock cycle;

a circuit for receiving said hit signal output from said holding circuit and a refresh clock signal; said circuit performing control so that, when said hit signal is in an active state, said refresh clock signal is not propagated to said counter to halt the count operation thereof, and so that, when said hit signal is in an inactive state, said refresh clock signal is propagated to said counter; and a circuit for executing bit-manipulation on the counter output and modifying at least a part thereof, based on said bit manipulation information output from said storage unit, to generate said row address which refresh period is subject to change.

18. The semiconductor memory device according to claim 3, further comprising:

a storage unit for receiving an output of said counter as an address, said storage unit storing in a cell thereof to be accessed by said address the first information as to whether or not said counter output is to be replaced by said row address which refresh period is subject to change and the second information as to whether or not refresh having an output of said counter as a refresh address is to be skipped over;

a holding circuit for setting an output hit signal to an active state based on the first and second information output from said storage unit and for resetting the hit signal to an inactive state in the next following clock cycle;

a circuit for receiving said hit signal output from said holding circuit and a refresh clock signal; said circuit performing control so that, when said hit signal is in an active state, said refresh clock signal is not propagated to said counter to halt the count operation thereof, and so that, when said hit signal is in an inactive state, said refresh clock signal is propagated to said counter;

a circuit for halting the refresh operation based on said second information output from said storage unit and on a preset bit signal of said counter output to halt the refresh operation; and a circuit for modifying at least a part of said counter output to generate said row address which refresh period is subject to change, when said hit signal is in an activate state.

19. The semiconductor memory device according to claim 18, wherein the bit width of said counter output is larger by at least one bit than the bit width of the refresh address.

20. The semiconductor memory device according to claim 3, wherein said control means performs control so that the refreshing using as a refresh address said counter output interrupted by said row address whose refresh period is subject to change is executed in the next cycle following the refreshing using as a refresh address said row address whose refresh period is subject to change.

* * * * *